United States Patent
Moon

(10) Patent No.: US 10,199,272 B2
(45) Date of Patent: Feb. 5, 2019

(54) ELECTRONIC DEVICE AND METHOD FOR FABRICATING THE SAME

(71) Applicant: SK hynix Inc., Icheon-Si (KR)

(72) Inventor: Joo-Young Moon, Icheon-si (KR)

(73) Assignee: SK hynix Inc., Incheon-si (KR)

( * ) Notice: Subject to any disclaimer, the term of this patent is extended or adjusted under 35 U.S.C. 154(b) by 0 days.

(21) Appl. No.: 15/940,845

(22) Filed: Mar. 29, 2018

(65) Prior Publication Data

US 2018/0218945 A1    Aug. 2, 2018

Related U.S. Application Data

(63) Continuation of application No. 15/237,356, filed on Aug. 15, 2016, now Pat. No. 9,935,007.

(30) Foreign Application Priority Data

Nov. 26, 2015  (KR) .......................... 10-2015-0166287

(51) Int. Cl.
*H01L 23/48*  (2006.01)
*H01L 21/768*  (2006.01)
(Continued)

(52) U.S. Cl.
CPC .. *H01L 21/76897* (2013.01); *H01L 21/76816* (2013.01); *H01L 21/76832* (2013.01);
(Continued)

(58) Field of Classification Search
CPC ......... H01L 21/76897; H01L 21/76816; H01L 27/2436; H01L 27/228; H01L 27/222; H01L 27/11502; H01L 27/2463; H01L 21/76832; H01L 23/5226; H01L 23/528; H01L 23/5283; H01L 28/00; H01L 27/10888; H01L 21/76834
(Continued)

(56) References Cited

U.S. PATENT DOCUMENTS 5,895,947 A    4/1999  Lee et al.
8,093,125 B2   1/2012  Kim
(Continued)

FOREIGN PATENT DOCUMENTS

KR    10-2011-0001703 A    1/2011
KR       10-1062838 B1     9/2011

OTHER PUBLICATIONS

English translation of Korean Patent KR 10-1062838 assigned to Kim dated Sep. 7, 2011.

*Primary Examiner* — Thinh T Nguyen
(74) *Attorney, Agent, or Firm* — Perkins Coie LLP

(57) ABSTRACT

A semiconductor device may include: a plurality of first contacts arranged at a predetermined distance in a first direction and a second direction crossing the first direction; a plurality of second contacts alternately arranged between the first contacts and arranged at a predetermined distance in the first direction and the second direction; a plurality of dog bone-type conductive lines connected to the second contacts arranged in the second direction, respectively, among the plurality of second contacts, and having concave parts and convex parts; and a plurality of etching prevention patterns formed over the plurality of conductive lines so as to overlap the conductive lines, respectively.

19 Claims, 15 Drawing Sheets

(51) Int. Cl.
*H01L 23/522* (2006.01)
*H01L 23/528* (2006.01)
*H01L 27/11502* (2017.01)
*H01L 27/22* (2006.01)
*H01L 27/24* (2006.01)
*H01L 49/02* (2006.01)
H01L 27/02 (2006.01)
H01L 27/108 (2006.01)

(52) U.S. Cl.
CPC ........ *H01L 23/528* (2013.01); *H01L 23/5226* (2013.01); *H01L 23/5283* (2013.01); *H01L 27/11502* (2013.01); *H01L 27/222* (2013.01); *H01L 27/228* (2013.01); *H01L 27/2436* (2013.01); *H01L 27/2463* (2013.01); *H01L 28/00* (2013.01); H01L 21/76834 (2013.01); H01L 27/0207 (2013.01); H01L 27/10885 (2013.01); H01L 27/10888 (2013.01)

(58) Field of Classification Search
USPC ................ 257/773, 758, 306, 532, E21.008, 257/E21.854; 438/618, 666, 386, 565, 438/622
See application file for complete search history.

(56) References Cited

U.S. PATENT DOCUMENTS

2003/0222292 A1* 12/2003 Joo .................... H01L 27/2436
257/296
2011/0070716 A1    3/2011 Kim
2014/0061743 A1    3/2014 Kim et al.

\* cited by examiner

ELECTRONIC DEVICE AND METHOD FOR FABRICATING THE SAME

CROSS-REFERENCE TO RELATED APPLICATIONS

The present application is a continuation of, and claims priority and benefits of, U.S. patent application Ser. No. 15/237,356, published as US 2017/0154817 A1, entitled "ELECTRONIC DEVICE AND METHOD FOR FABRICATING THE SAME," and filed on Aug. 15, 2016, which further claims priority of Korean Patent Application No. 10-2015-0166287, entitled "ELECTRONIC DEVICE AND METHOD FOR FABRICATING THE SAME" and filed on Nov. 26, 2015. The contents of the before-mentioned patent applications (including US 2017/0154817 A1) are incorporated herein by reference in their entirety as part of the disclosure of this document.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes a semiconductor memory capable of improving the characteristic of a variable resistance element.

In an implementation, a semiconductor device may include: a plurality of first contacts arranged at a predetermined distance in a first direction and a second direction crossing the first direction; a plurality of second contacts alternately arranged between the first contacts and arranged at a predetermined distance in the first direction and the second direction; a plurality of dog bone-type conductive lines connected to the second contacts arranged in the second direction, respectively, among the plurality of second contacts, and having concave parts and convex parts; and a plurality of etching prevention patterns formed over the plurality of conductive lines so as to overlap the conductive lines, respectively.

Implementations of the above semiconductor device may include one or more the following.

The etching prevention pattern has a line width equal to or larger than a line width of the conductive line. The concave parts of the conductive line are located at positions corresponding to the first contacts. The convex parts of the conductive line are located over the second contacts arranged in the second direction. The etching prevention pattern is formed in a dog bone type with concave parts and convex parts, and has a line width equal to or larger than a line width of the conductive line. The etching prevention pattern has concave parts and convex parts, and is formed in a reverse dog bone type of which convex parts and concave parts overlap the concave parts and the convex parts of the conductive line, respectively. The etching prevention pattern is formed in a line type, and has a line width equal to or larger than a line width of the convex parts of the conductive line. The semiconductor device further comprising a spacer formed on both side surfaces of the conductive line. The semiconductor device further comprising a plurality of third contacts arranged in a mesh type so as to overlap the first contacts. The semiconductor device further comprising data storage elements arranged over the third contacts so as to be in contact with the third contacts. The data storage element comprises a capacitor or variable resistance element. The etching prevention pattern comprises an insulating material. The etching prevention pattern comprises a nitride material.

In an implementation, a semiconductor device may include: a plurality of first contacts arranged at a predetermined distance in a first direction and a second direction crossing the first direction; a plurality of second contacts alternately arranged between the first contacts, and arranged at a predetermined distance in the first direction and the second direction; a plurality of conductive lines connected to the second contacts arranged in the second direction, respectively, among the plurality of second contacts; and a plurality of etching prevention patterns formed over the plurality of conductive lines so as to overlap the conductive lines, respectively, and having a line width equal to or larger than a line width of the conductive lines.

Implementations of the above semiconductor device may include one or more the following.

The etching prevention pattern comprises a line pattern. The etching prevention pattern is formed in a dog bone type with concave parts and convex parts, and the convex parts of the etching prevention pattern are located at positions corresponding to the first contacts. The semiconductor device further comprising a spacer formed on both side surfaces of the conductive line. The semiconductor device further comprising a plurality of third contacts arranged in a mesh type so as to overlap the first contacts. The semiconductor device further comprising data storage elements formed over the third contacts so as to be in contact with the third contacts. The data storage element comprises a capacitor or variable resistance element. The etching prevention pattern comprises an insulating material. The etching prevention pattern comprises a nitride material.

In an implementation, there is provided an electronic device including a semiconductor memory. The semiconductor memory may include: a plurality of first bottom contacts arranged at a predetermined distance in a first direction and a second direction crossing the first direction; a plurality of source contacts alternately arranged between the first bottom contacts, and arranged at a predetermined distance in the first direction and the second direction; a plurality of source lines connected to the source contacts arranged in the second direction, respectively, among the plurality of source contacts; a plurality of etching prevention patterns formed over the plurality of source lines so as to overlap the source lines, respectively, and having a line width equal to or larger than a line width of the source lines; a plurality of second bottom contacts arranged to overlap the first bottom contacts; and a plurality of variable resistance elements arranged over the plurality of second bottom contacts so as to be in contact with the second bottom contacts.

Implementations of the above electronic device may include one or more the following.

The etching prevention pattern comprises a line pattern. The etching prevention pattern is formed in a dog bone type with concave parts and convex parts, and the convex parts of the etching prevention pattern are located at positions corresponding to the first bottom contacts. The source line comprises a dog bone type with concave parts and convex parts, and the concave parts of the source line are located at positions corresponding to the first bottom contacts. The source line comprises a dog bone type with concave parts and convex parts, and the convex parts of the source line are located over the source contacts arranged in the second direction. The source line and the etching prevention pattern comprise a dog bone type with concave parts and convex parts. The source line comprises a dog bone type with concave parts and convex parts, and the etching prevention pattern comprises a reverse dog bone type of which convex parts and concave parts overlap the concave parts and convex parts of the source line, respectively. The electronic device further comprising a spacer formed on both side surfaces of the source line. The etching prevention pattern comprises an insulating material. The etching prevention pattern comprises a nitride material. The variable resistance element has a single-layer or multilayer structure which includes a metal oxide, a phase change material, a ferrodielectric material or a ferromagnetic material.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In an implementation, a method for fabricating an electronic device including a semiconductor memory may include: forming a plurality of first bottom contacts over a substrate, the plurality of first bottom contacts being arranged at a predetermined distance in a first direction and a second direction crossing the first direction; forming a plurality of source contacts which are alternately arranged between the first bottom contacts, and arranged at a predetermined distance in the first direction and the second direction; forming a plurality of source lines to be in contact with the source contacts arranged in the second direction, respectively, among the plurality of source contacts; forming a plurality of etching prevention patterns which are formed over the plurality of source lines so as to overlap the source lines, respectively, and have a line width equal to or larger than a line width of the source lines; forming a plurality of second bottom contacts over the first bottom contacts so as to overlap the first bottom contacts; and forming a plurality of variable resistance elements over the second bottom contacts so as to overlap the second bottom contacts.

Implementations of the above method may include one or more the following.

The etching prevention pattern comprises a line pattern. The etching prevention pattern is formed in a dog bone type with concave parts and convex parts, and the convex parts of the etching prevention pattern are located at positions corresponding to the first bottom contacts. The source line comprises a dog bone type with concave parts and convex parts, and the concave parts of the source line are located at positions corresponding to the first bottom contacts. The source line comprises a dog bone type with concave parts and convex parts, and the convex parts of the source line are located over the source contacts arranged in the second direction. The source line and the etching prevention pattern comprise a dog bone type with concave parts and convex parts. The source line comprises a dog bone type with concave parts and convex parts, and the etching prevention pattern comprises a reverse dog bone type of which convex parts and concave parts overlap the concave parts and convex parts of the source line, respectively. The method further comprising forming a spacer on both side surfaces of the source line. The etching prevention pattern comprises an insulating material. The etching prevention pattern comprises a nitride material. The variable resistance element has a single-layer or multilayer structure which includes a metal oxide, a phase change material, a ferrodielectric material or a ferromagnetic material.

These and other aspects, implementations and associated advantages are described in greater detail in the drawings, the description and the claims.

DETAILED DESCRIPTION

Figure 1:
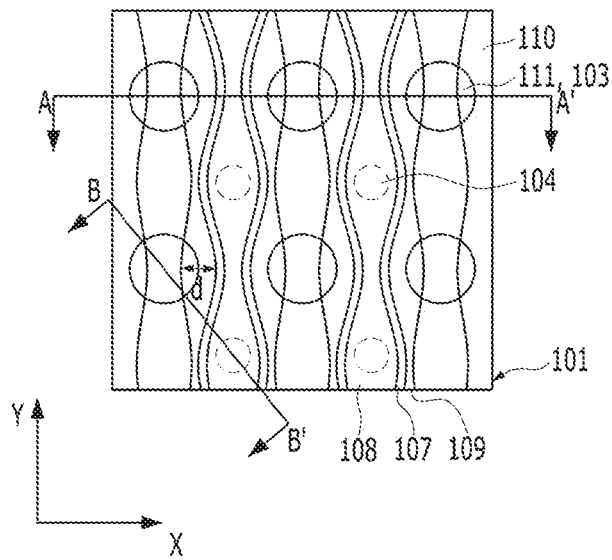
FIG. 1 is a plan view of a semiconductor device in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 2A:
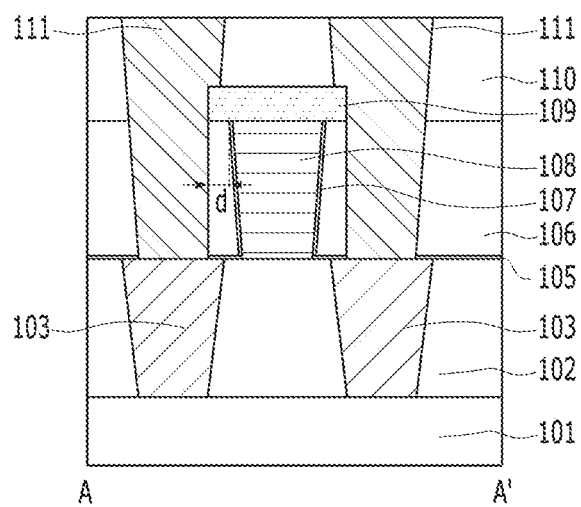
FIGS. 2A and 2B are cross-sectional views of the semiconductor device in accordance with the implementation.
Figure 2B:
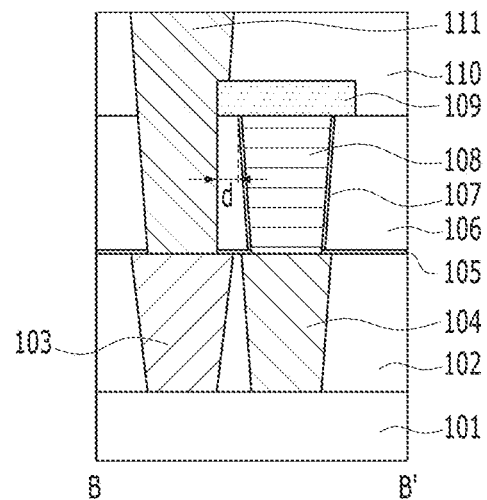

FIG. 1 is a plan view of a semiconductor device in accordance with an implementation. FIGS. 2A and 2B are cross-sectional views of the semiconductor device in accordance with the implementation. FIG. 2A is a cross-sectional view taken along a direction A-A' of FIG. 1, and FIG. 2B is a cross-sectional view taken along a direction B-B' of FIG. 1. In order to promote understanding, the semiconductor device in accordance with the implementation will be described with reference to FIGS. 1, 2A, and 2B.

As illustrated in FIGS. 1, 2A, and 2B, the semiconductor device in accordance with the implementation may include a substrate 101 and a first interlayer dielectric layer 102 formed over the substrate 101. The semiconductor device may further include a plurality of first and second contacts 103 and 104 connected to the substrate 101 through the first interlayer dielectric layer 102. The semiconductor device may further include an etch stop layer 105 and a second interlayer dielectric layer 106 which are formed over the first interlayer dielectric layer 102. The semiconductor device may further include a conductive line 108 connected to the second contact 104 through the second interlayer dielectric layer 106 and the etch stop layer 105. The semiconductor may further include an etching prevention pattern 109 formed over the conductive line 108 so as to overlap the conductive line 108. The semiconductor device may further include a third interlayer dielectric layer 110 formed over the second interlayer dielectric layer 106. The semiconductor device may further include a plurality of third contacts 111 connected to the first contacts 103 through the third and second interlayer dielectric layers 110 and 106 and the etch stop layer 105.

The substrate 101 may include a semiconductor substrate such as a silicon substrate. The first interlayer dielectric layer 102 may serve as an interlayer insulation layer between the substrate 101 and the upper layer, and serve to insulate adjacent contacts from each other. The first interlayer dielectric layer 102 may include an insulating material.

The first and second contacts 103 and 104 may include a conductive material. The first and second contacts 103 and 104 may include a mesh-type arrangement structure in which the first and second contacts 103 and 104 are arranged at a predetermined distance in a first direction X and a second direction Y crossing the first direction X. In particular, the first and second contacts 103 and 104 may be alternately arranged so as not to overlap each other in any direction of the first and second directions X and Y. For example, as illustrated in FIG. 1, the second contact 104 may be arranged at a predetermined distance among four first contacts 103. In a diagonal direction as illustrated in FIG. 2B, the first contacts 103 and the second contacts 104 may be alternately arranged. The first contacts 103 and the second contacts 104 may be formed at the same time. Alternatively, after the first contacts 103 are formed, the second contacts 104 may be sequentially formed.

The etch stop layer 105 may serve to prevent the damage of the first interlayer dielectric layer 102 and the first and second contacts 103 and 104, when the conductive line 108 and the third contacts 111 are formed. The etch stop layer 105 may include a material having an etch selectivity with respect to the first interlayer dielectric layer 102 and the first and second contacts 103 and 104. The etch stop layer 105 may include an insulating material.

The second interlayer dielectric layer 106 may serve as an interlayer insulating layer between the first and second contacts 103 and 104 and the upper layer, and serve to insulate the conductive lines 108 from the third contacts 111. The second interlayer dielectric layer 106 may include an insulating material.

The conductive lines 108 may be repetitively arranged at a predetermined distance in the first direction X. The conductive lines 108 may be extended to overlap the second contacts 104 arranged in the second direction Y. In FIG. 1, the conductive line 108 may include a dog bone-type line pattern with concave parts and convex parts, but is not limited as such and can be in other geometries or shapes. The shapes of the conductive line 108 and the etching prevention pattern 109 will be described in detail with reference to FIGS. 3A to 3E. The conductive line 108 may serve as a power line which is connected to the second contacts 104 so as to apply a voltage or current. At this time, the semiconductor device may further include a spacer 107 formed at both side surfaces of the conductive line 108. In particular, when the conductive line 108 is formed in a dog bone type with concave parts and convex parts as illustrated in FIG. 1, the conductive line 108 may be arranged in such a manner that the concave parts of the conductive line 108 correspond to the first contacts 103 and the convex parts of the conductive line 108 overlap the second contacts 104, respectively.

The etching prevention patterns 109 may be extended to overlap the conductive lines 108 and the second contacts 104, and repetitively arranged at a predetermined distance in the first direction X. The etching prevention pattern 109 may be formed to have a line width equal to or more than the width of the conductive line 108 at portions corresponding to the first contacts 103. FIG. 1 illustrates that the etching prevention pattern 109 has concave parts and convex parts, and includes a reverse dog bone-type line pattern of which concave parts and convex parts overlap the convex parts and concave parts of the conductive line 108, respectively. However, the shape of the etching prevention pattern 109 is not so limited and can be in various geometries or shapes. Additional examples for the etching prevention pattern 109 are described in detail with reference to FIGS. 3A to 3E. As the etching prevention pattern 109 has a line width equal to or larger than the line width of the conductive line 108 at the portions corresponding to the first contacts 103, a distance D between the conductive line 108 and the third contact 111 may be secured to prevent a short fail. The etching prevention pattern 109 may include a material having an etch selectivity with respect to the third interlayer dielectric layer 110 and the second interlayer dielectric layer 106. The etching prevention pattern 109 may include an insulating material. For example, when the second and third interlayer dielectric layers 106 and 110 include an oxide material, the etching prevention pattern 109 may include a nitride material.

The third contacts 111 may include an arrangement structure in which the third contacts 111 are overlapped by the first contacts 103, that is, a mesh-type or pattern arrangement structure in which the third contacts 111 are arranged in the first direction X and the second direction Y crossing the first direction X. The line width of the third contacts 111 may be configured to be smaller than the line width of the etching prevention pattern 109. This is because the etching prevention pattern 109 is not damaged but remains due to the etching selectivity between the second and third interlayer dielectric layers 106 and 110 and the etching prevention pattern 109 during the contact hole formation process for forming the third contacts 111, and the self align etch of contact holes is performed. That is, the line width of the contact holes which are etched under the etching prevention pattern 109 may be determined according to the position of the etching prevention pattern 109. Thus, the third contact 111 may secure a distance from the conductive line 108 by a distance d between one surface of the etching prevention pattern 109 and one surface of the conductive line 108. As a result, a short fail between the third contact 111 and the conductive line 108 can be prevented.

FIGS. 3A to 3E are plan views illustrating the relationship between the conductive line and the etching prevention pattern in accordance with the implementation. Reference numeral 100A may represent a conductive line, and reference numeral 100B may represent an etching prevention pattern. The conductive line and the etching prevention pattern which are illustrated in FIGS. 3A to 3E may correspond to the conductive line 108 and the etching prevention pattern 109 which are illustrated in FIGS. 1, 2A, and 2B.

Figure 3A:
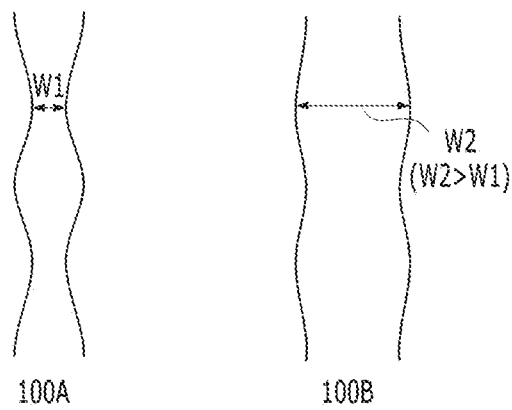
FIGS. 3A to 3E are plan views illustrating the relationship between a conductive line and an etching prevention pattern in accordance with the implementation

As illustrated in FIG. 3A, the conductive line 100A may be formed in a dog bone-type line pattern with concave parts and convex parts. At this time, the concave parts of the conductive line 100A may correspond to the first and third contacts 103 and 111 of FIGS. 1, 2A, and 2B. The convex parts of the conductive line 100A may overlap the second contacts 104.

The etching prevention pattern 100B may also be formed in a line type with concave parts and convex parts. At this time, the etching prevention pattern 100B may have a reverse dog bone shape of which the concave parts and convex parts overlap the convex parts and concave parts of the conductive line 100A, respectively. That is, the concave parts of the etching prevention pattern 100B may overlap the second contacts 104, and the convex parts of the etching prevention pattern 100B may correspond to the first and third contacts 103 and 111. In particular, the line width W2 of the etching prevention pattern 100B may be adjusted to a larger value than the line width W1 of the concave parts of the conductive line 100A. The conductive line 100A and the third contact 111 of FIG. 2A may secure a distance corresponding to ½ of a difference in line width between the etching prevention pattern 100B and the conductive line 100A.

Figure 3B:
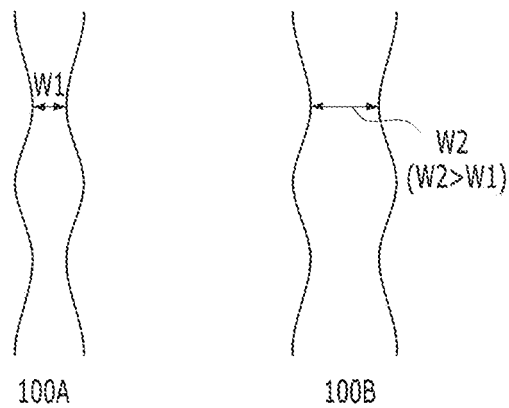

As illustrated in FIG. 3B, both of the conductive line 100A and the etching prevention pattern 100B may be formed in a dog bone-shaped line type with concave parts and convex parts. The concave parts of the conductive line 100A and the etching prevention pattern 100B may correspond to the first contacts 103 and the third contacts 111 of FIG. 2A. The convex parts of the conductive line 100A and the etching prevention pattern 100B may overlap the second contacts 104 of FIG. 2B. At this time, the line width W2 of the concave parts of the etching prevention pattern 100B may be adjusted to a larger value than the line width W1 of the concave parts of the conductive line 100A.

Figure 3C:
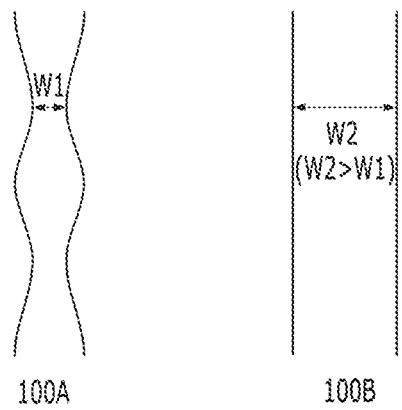

As illustrated in FIG. 3C, the conductive line 100A may be formed in a dog bone-shaped line type with concave and convex parts, and the etching prevention pattern 100B may be formed in a line type. The concave parts of the conductive line 100A may correspond to the first contacts 103 and the third contacts 111 of FIG. 2A. At this time, the line width W2 of the etching prevention pattern 100B may be adjusted to a larger value than at least the line width W1 of the concave parts of the conductive line 100A.

Figure 3D:
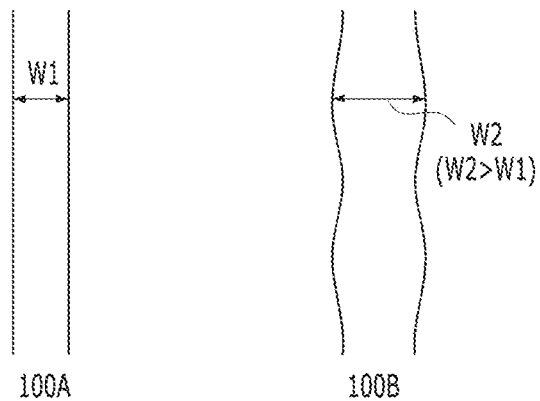

As illustrated in FIG. 3D, the conductive line 100A may be formed in a line type, and the etching prevention pattern 100B may be formed in a dog bone-shaped line type with concave parts and convex parts. The convex parts of the conductive line 100B may correspond to the first contacts 103 and the third contacts 111 in FIG. 2A. At this time, the line width W2 of the convex parts of the etching prevention pattern 100B may be adjusted to a larger value than the line width W1 of the conductive line 100A.

Figure 3E:
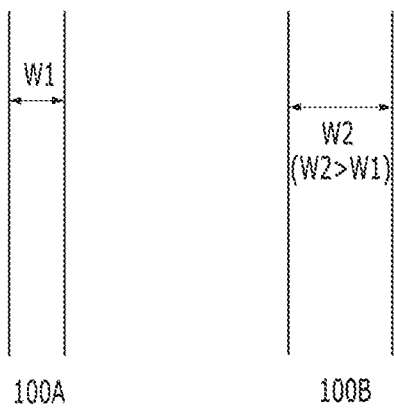

As illustrated in FIG. 3E, the conductive line 100A and the etching prevention pattern 100B may be formed in a line type. At this time, the line width W2 of the etching prevention pattern 100B may be adjusted to a larger value than the line width W1 of the conductive line 100A.

The present implementation may include all applicable conductive lines and etching prevention patterns other than the conductive lines and the etching prevention patterns which are illustrated in FIGS. 3A to 3E. At this time, the line width of the etching prevention patterns corresponding to the first and third contacts may be adjusted to a larger value than the line width of the conductive lines.

Figure 4:
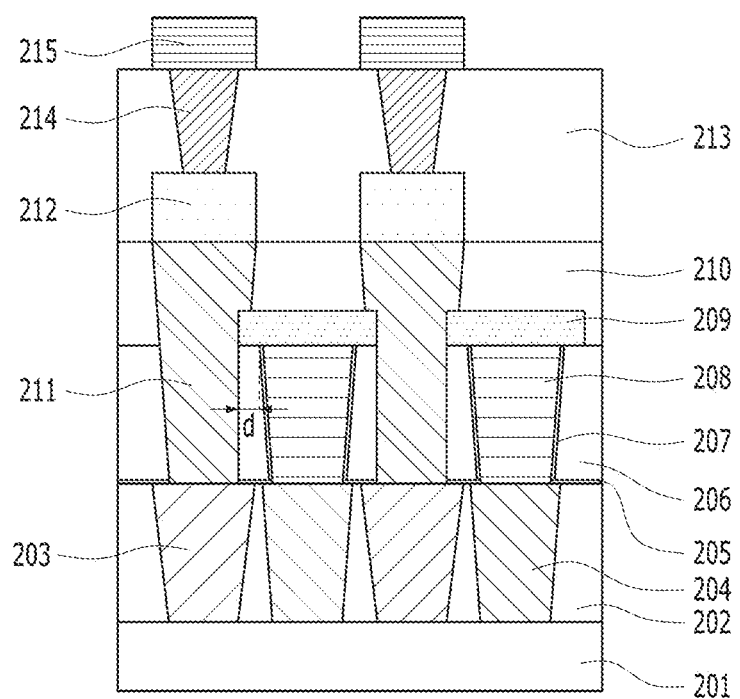
FIG. 4 is a cross-sectional view of a memory device in accordance with a first implementation.

FIG. 4 is a cross-sectional view of a memory device in accordance with a first implementation. The memory device in accordance with the first implementation may have an n spin transfer torque RAM (STTRAM) structure including a variable resistance element as a memory element to store data based on different resistance states, such as magnetic tunnel junction (MTJ) structures.

As illustrated in FIG. 4, the memory device in accordance with the first implementation may include a substrate 201 in which required elements (not illustrated), for example, a transistor for controlling access to a variable resistance element 212 are formed. The memory device may further include first and second bottom contacts 203 and 211 which are positioned over the substrate 201 and connect the bottoms of a plurality of variable resistance elements 212 to parts of the substrate 201, for example, the drains of transistors. The memory device may further include source contacts 204 which are alternately arranged between the first bottom contacts 203 and electrically couple the source lines 208 to parts of the substrates 201, for example, the sources of the transistors. The memory device may further include an etching prevention pattern 209 which overlaps the source line 208 and secures a distance between the source line 208 and the second bottom contact 211, in order to prevent a short fail. The memory device may include a top contact 214 for connecting the variable resistance element 212 to a bit line 215. The memory device may further include a first interlayer dielectric layer 202 for insulating the first bottom contact 203 from the source contact 204, a second interlayer dielectric layer 206 for insulating the source lines 208 from each other, a third interlayer dielectric layer 210 for insulating the second bottom contacts 211 from each other, and a fourth interlayer dielectric layer 213 for insulating the variable resistance elements 212 from each other.

The substrate 201 may include a semiconductor substrate such as a silicon substrate, which includes transistors (not illustrated).

The first to fourth interlayer dielectric layers 202, 206, 210, and 213 may include an insulating material.

The first and second bottom contacts 203 and 211 and the top contact 214 may serve as contacts for electrically coupling the substrate 201 and the variable resistance element 212, and electrically coupling the variable resistance element 212 and the bit line 215. For this operation, the first and second bottom contacts 203 and 211 and the top contacts 214 may be formed of a conductive material.

The source contact 204 may serve as a contact for electrically coupling the source line 208 and the substrate 201. For this operation, the source contact 204 may be formed of a conductive material.

The first bottom contact 203, the source contact 204, the source line 208, the etching prevention pattern 209, and the second bottom contact 211 may correspond to the first contact 103, the second contact 104, the conductive line 108, the etching prevention pattern 109, and the third contact 111 in FIGS. 1, 2A, and 2B, and include the same arrangement structure.

That is, the first and second bottom contacts 203 and 211 may have a mesh-type arrangement structure in which the first and second bottom contacts 203 and 211 are isolated at a predetermined distance in the first direction X and the second direction Y crossing the first direction (refer to FIG. 1). The source contacts 204 may have a mesh-type arrangement structure in which the source contacts 204 are isolated at a predetermined distance in the first direction X and the second direction Y crossing the first direction (refer to FIG. 1). At this time, the first and second bottom contacts 203 and 211 and the source contacts 204 may be alternately arranged so as not to overlap each other in the first and second directions. In particular, the first and second bottom contacts 203 and 211 and the source contacts 204 may be alternately arranged at a predetermined distance in the diagonal direction indicated by the reference line B-B' of FIG. 1.

In the present implementation, the memory device may further include the etching prevention pattern 209 formed over the source line 208. As the line width of the etching prevention pattern 209 is adjusted to a larger value than the line width of the source line 208 at portions corresponding to the first and second bottom contacts 203 and 211, a distance d between the second bottom contact 211 and the source line 208 may be secured as a value corresponding to a distance d between the etching prevention pattern 209 and the source line 208, which makes it possible to prevent a short fail between the second bottom contact 211 and the source line 208.

The variable resistance element 212 may include a material which switches between different resistance states, according to a voltage or current applied across the variable resistance element 212. The variable resistance element 212 may include various materials used for RRAM, PRAM, FRAM, MRAM and the like. For example, the various materials may include a transition metal oxide, a metal oxide such as a perovskite-based material, a phase change material such as a chalcogenide-based material, a ferrodielectric material, and a ferromagnetic material. The variable resistance element 212 may have a single-layer structure or a multilayer structure which includes two or more layers so as to exhibit a variable resistance characteristic.

The bit line 215 may include a power line for applying a voltage or current to the variable resistance element 212 through the top contact 214.

Figure 5:
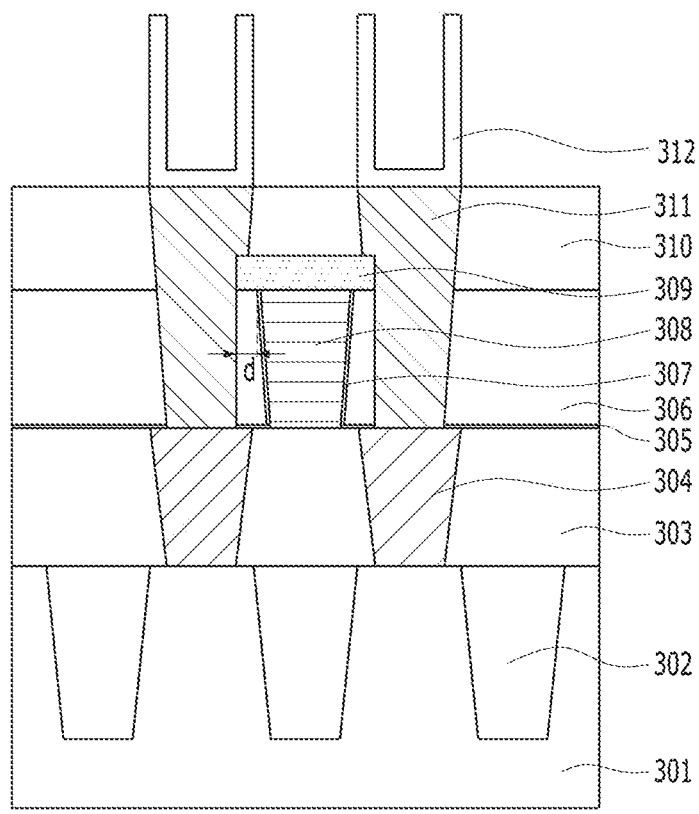
FIG. 5 is a cross-sectional view of a memory device in accordance with a second implementation.

FIG. 5 is a cross-sectional view of a memory device in accordance with a second implementation. The memory device in accordance with the second implementation may have a DRAM structure including a capacitor as a memory element.

As illustrated in FIG. 5, the memory device in accordance with the second implementation may include a substrate 301 in which required elements (not illustrated), for example, a buried gate (not illustrated) and an isolation layer 302 are formed. The memory device may also include landing plug contacts 304 and storage node contacts 311 which are positioned over the substrate 301 and connect the bottoms of a plurality of capacitors 312 to parts of the substrate 301, for example, the sources of buried gates. The memory device may further include a bit line 308 coupled to the drains of the buried gates through a bit line contact (not illustrated). The memory device may additionally include a spacer 307 formed on both side surfaces of the bit line 308.

In the present implementation, the memory device may include an etching prevention pattern 309 formed over the bit line 308 so as to overlap the bit line 308. As the line width of the etching prevention pattern 309 is adjusted to a larger value than the line width of the bit line 308 at a portion corresponding to the storage node contact 311, a distance d between the storage node contact 311 and the bit line 308 may be secured as a value corresponding to a distance d between the etching prevention pattern 309 and the bit line 308, which makes it possible to prevent a short fail between the bit line 308 and the storage node contact 311.

FIGS. 6A to 6I are cross-sectional views illustrating a method for fabricating the memory device in accordance with the first implementation.

Figure 6A:
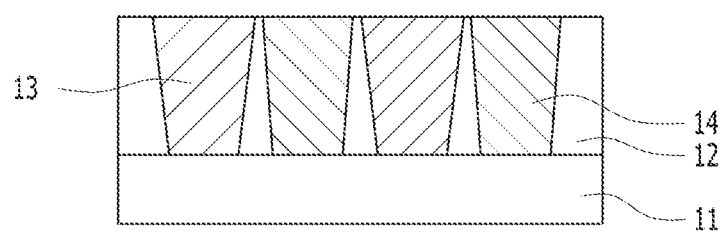
FIGS. 6A to 6I are cross-sectional views illustrating a method for fabricating the memory device in accordance with the first implementation.

As illustrated in FIG. 6A, a first interlayer dielectric layer 12 may be formed over a substrate 11 including required elements (not illustrated), for example, transistors. The substrate 11 may include a semiconductor substrate such as a silicon substrate.

The first interlayer dielectric layer 12 may serve as an insulating layer for insulating adjacent first bottom contacts 13 from each other and serve to insulate the substrate from the upper layer. The first interlayer dielectric layer 12 may include an insulating material.

Then, a plurality of first bottom contacts 13 may be formed to connect to the substrate 11 through the first interlayer dielectric layer 12. The first bottom contacts 13 may be formed through a series of processes of selectively etching the first interlayer dielectric layer 12 to form contact holes which expose parts of the substrate 11, for example, the drain regions of the transistors, burying a conductive material in the contact holes, and isolating the first bottom contacts 13 adjacent to each other through the first interlayer dielectric layer 12. The first bottom contacts 13 may include a mesh-type arrangement structure in which the first bottom contacts 13 are arranged at a predetermined distance in the first and second directions X and Y as illustrated in FIG. 1.

Then, a plurality of source contacts 14 may be formed to connect to the substrate 11 through the first interlayer dielectric layer 12 between the first bottom contacts 13 adjacent to each other in a diagonal direction. The source contacts 14 may include a mesh-type arrangement structure in which the source contacts 14 are arranged at a predetermined distance in the first and second directions X and Y. The source contacts 14 may be formed through a series of processes of selectively etching the first interlayer dielectric layer 12 to form contact holes which expose the substrate 11 between the first bottom contacts 13 adjacent to each other in the diagonal direction, for example, the source regions of the transistors, burying a conductive material in the contact holes, and isolating the source contacts 14 adjacent to each other through the first interlayer dielectric layer 12. The source contacts 14 may be alternately arranged so as not to overlap the first bottom contacts 13 in the first and second directions X and Y.

Figure 6B:
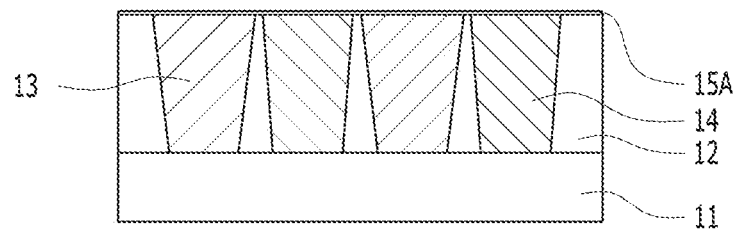

As illustrated in FIG. 6B, an etch stop layer 15A may be formed over the first interlayer dielectric layer 12 including the first bottom contacts 13 and the source contacts 14. The etch stop layer 15A may serve to prevent the damage of the first interlayer dielectric layer 12, the first bottom contacts 13, and the source contacts 14 during a subsequent etch process for forming a source line. For this operation, the etch stop layer 15A may include a material having an etch selectivity with respect to the first interlayer dielectric layer 12 and a second interlayer dielectric layer (not illustrated) which is to be formed during a subsequent process. For example, when the first and second interlayer dielectric layers include an oxide material, the etch stop layer 15A may include a nitride material.

Figure 6C:
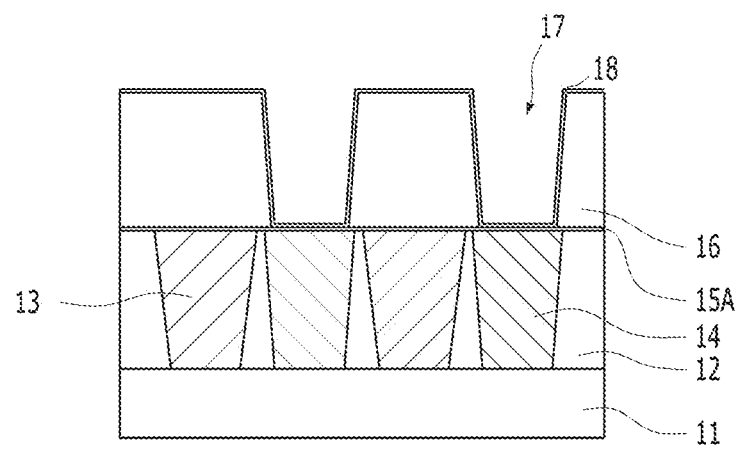

As illustrated in FIG. 6C, a second interlayer dielectric layer 16 may be formed over the etch stop layer 15A. The second interlayer dielectric layer 16 may include an insulating material having an etch selectivity with respect to the etch stop layer 15A.

Then, an opening 17 may be formed in a region which overlaps the source contact 14A extended in the second direction Y, through the second interlayer dielectric layer 16. The opening 17 may be defined to have the same pattern as the conductive lines 100A illustrated in FIGS. 3A to 3E.

Then, a spacer layer 18A may be formed along the opening 17. The spacer layer 18A may serve to prevent diffusion of a source line which is to be formed through a subsequent process, and insulate adjacent structures from each other. The spacer layer 18A may include a material having an etch selectivity with respect to the second interlayer dielectric layer 16. For example, when the second interlayer dielectric layer 16 includes an oxide material, the spacer layer 18A may include a nitride material.

Figure 6D:
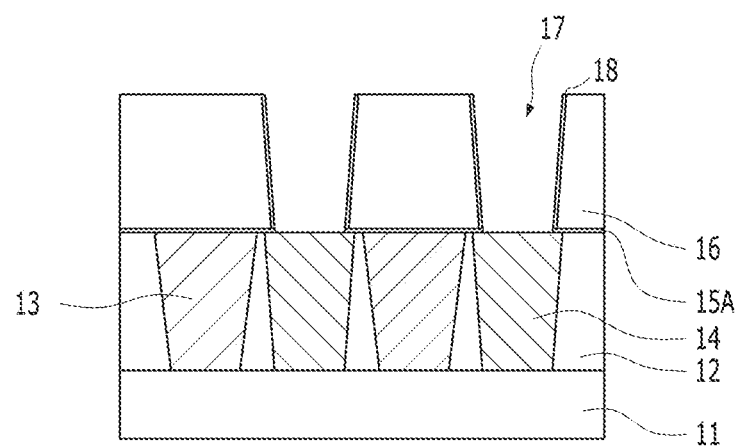

As illustrated in FIG. 6D, the spacer layer 18A may be etched. Thus, a spacer 18 may be formed on the sidewalls of the opening 17.

Then, the etch stop layer 15A on the bottom surface of the opening 17 may be etched to expose the source contact 14. Hereafter, the etched etch stop layer will be represented by reference numeral 15.

Figure 6E:
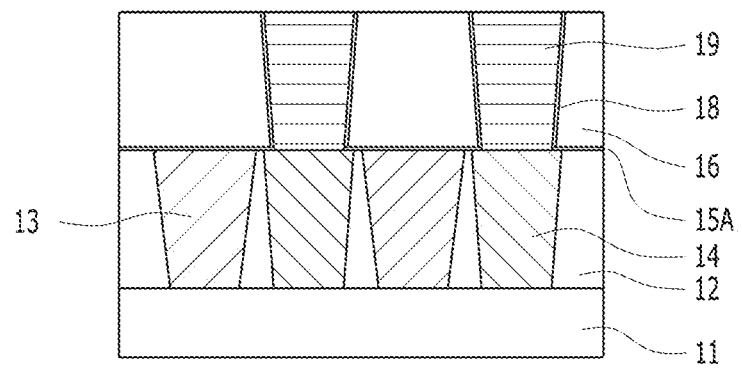

As illustrated in FIG. 6E, a source line 19 may be formed to fill the opening 17. The source line 19 may be formed through a series of processes of burying a conductive material in the opening 17 and electrically isolating the adjacent source lines 19 from each other. The isolation process may include etching (or polishing) the conductive material formed on the entire surface using a blanket etch process (for example, etch-back process) or a chemical mechanical polishing (CMP) process, until the second interlayer dielectric layer 16 is exposed. The source line 19 may include a conductive material. For example, the source line 19 may include copper (Cu).

Figure 6F:
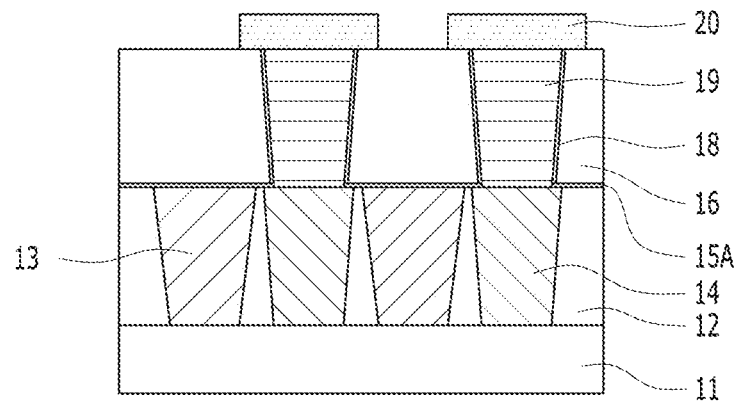

As illustrated in FIG. 6F, an etching prevention pattern 20 may be formed to overlap the source line 19. The etching prevention pattern 20 may include the same pattern as the etching prevention patterns 100B illustrated in FIGS. 3A to 3E. The etching prevention pattern 20 may induce self align etch of the contact holes through the etch selectivity, secure a distance between the source line 19 and second bottom contacts (not illustrated) which are to be formed through a subsequent process, and prevent a short fail therebetween. For this operation, the etching prevention pattern 20 may include a material having an etch selectivity with respect to the second interlayer dielectric layer 16. For example, when the second interlayer dielectric layer 16 includes an oxide material, the etching prevention pattern 20 may include a nitride material.

The line width of the etching prevention pattern 20 may be adjusted to a value equal to or larger than the line width of the source line 19. In particular, the line width of the etching prevention pattern 20 at a portion corresponding to the first bottom contact 13 may be adjusted to a larger value than the line width of the source line 19. The line widths and shapes of the etching prevention pattern 20 and the source line 19 may include the line widths and shapes illustrated in FIGS. 3A to 3E and applicable patterns thereof.

Figure 6G:
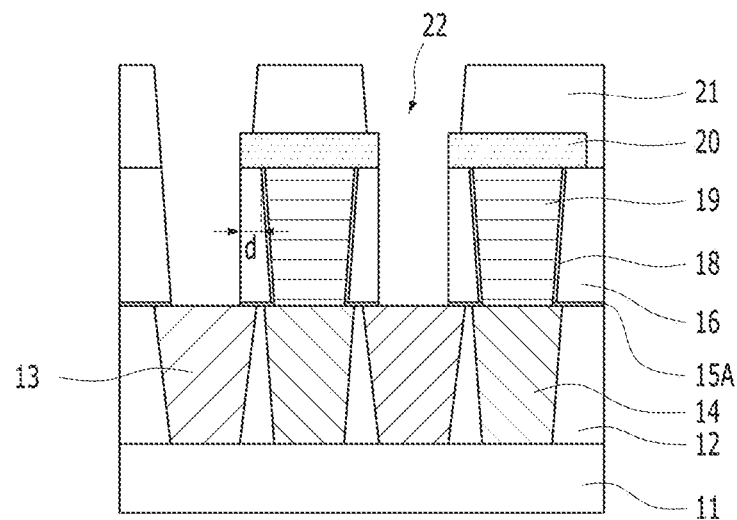

As illustrated in FIG. 6G, a third interlayer dielectric layer 21 may be formed over the second interlayer dielectric layer 16. The third interlayer dielectric layer 21 may include an insulating material having an etch selectivity with respect to the etching prevention pattern 20.

Then, the third interlayer dielectric layer 21, the second interlayer dielectric layer 16, and the etch stop layer 15 may be selectively etched to form contact holes 22 which expose the first bottom contacts 13. At this time, the etching prevention patterns 20 may be exposed due to mis-alignment and/or the density of patterns. The exposed etching prevention patterns 20 may not be damaged but remain due to the etching selectivity, and induce self align etch of the contact holes 22. That is, the line width of the contact hole 22 which is formed under the etching prevention pattern 20 may be determined according to the position and line width of the etching prevention pattern 20. As a result, a distance d between the source line 19 and the contact hole 22 in which a second bottom contact (not illustrated) is to be formed through a subsequent process may be secured as a value corresponding to a distance d between one surface of the etching prevention pattern 20 and one surface of the source line 19.

Figure 6H:
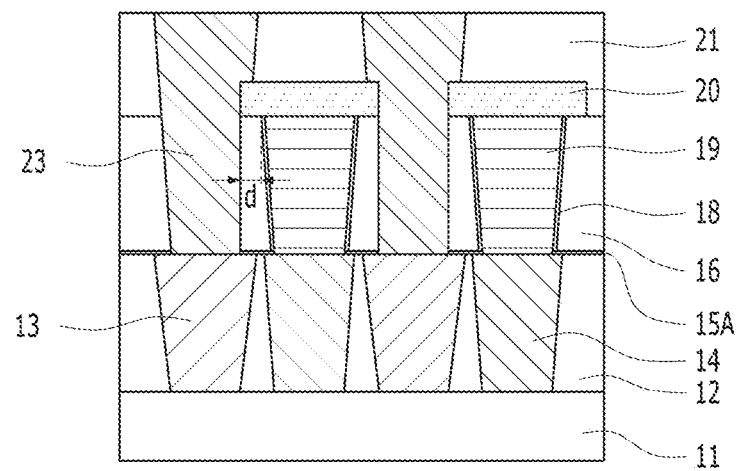

As illustrated in FIG. 6H, second bottom contacts 23 may be formed to fill the contact holes 22. The second bottom contacts 23 may be formed through a series of processes of burying a conductive material in the contact holes 22 and electrically isolating the adjacent second bottom contacts 23.

Through the self align etch of the contact holes 22 in FIG. 6G, a distance between the bottom contact 23 and the source line 19 can be secured to prevent a short to the source line 19.

Figure 6I:
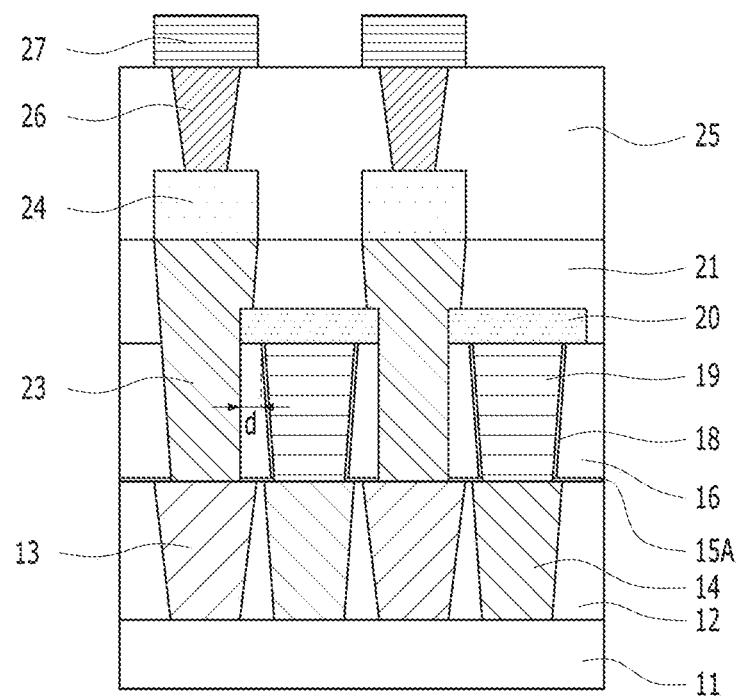

As illustrated in FIG. 6I, a variable resistance element 24 may be formed over the second bottom contact 23. The variable resistance element 24 may include a material which switches between different resistance states, according to a voltage or current applied across the variable resistance element 24. Such different resistance states can be used to represent different data for data storage. The variable resistance element 24 may include various materials used for RRAM, PRAM, FRAM, MRAM and the like. For example, the various materials may include a transition metal oxide, a metal oxide such as a perovskite-based material, a phase change material such as a chalcogenide-based material, a ferrodielectric material, and a ferromagnetic material. The variable resistance element 24 may have a single-layer structure or a multilayer structure which includes two or more layers so as to exhibit a variable resistance characteristic.

Then, a fourth interlayer dielectric layer 25 may be formed over the third interlayer dielectric layer 21 so as to fill the space between the variable resistance elements 24. The fourth interlayer dielectric layer 25 may include an insulating material.

Then, top contacts 26 may be formed to be in contact with the variable resistance elements 24 through the fourth interlayer dielectric layer 25. The top contacts 26 may be formed through a series of processes of selectively etching the fourth interlayer dielectric layer 25 so as to form contact holes which expose the tops of the variable resistance elements 24, burying a conductive material in the contact holes, and electrically isolating the adjacent top contacts 26.

Then, a bit line 27 may be formed over the fourth interlayer dielectric layer 25. The bit line 27 may be electrically coupled to the variable resistance elements 24 through the top contacts 26, while being in contact with the top contact 26. The bit line 27 may be configured to apply a voltage or current to the variable resistance elements 24, and formed in a line type overlapping the variable resistance elements 24 arranged in the second direction Y. The bit line 27 may include a conductive material.

In accordance with the implementations, the electronic device including a semiconductor memory and the method for fabricating the same can facilitate the process, and improve the characteristic of the variable resistance element.

The above and other memory circuits or semiconductor devices based on the disclosed technology can be used in a range of devices or systems. FIGS. 7-11 provide some examples of devices or systems that can implement the memory circuits disclosed herein.

Figure 7:
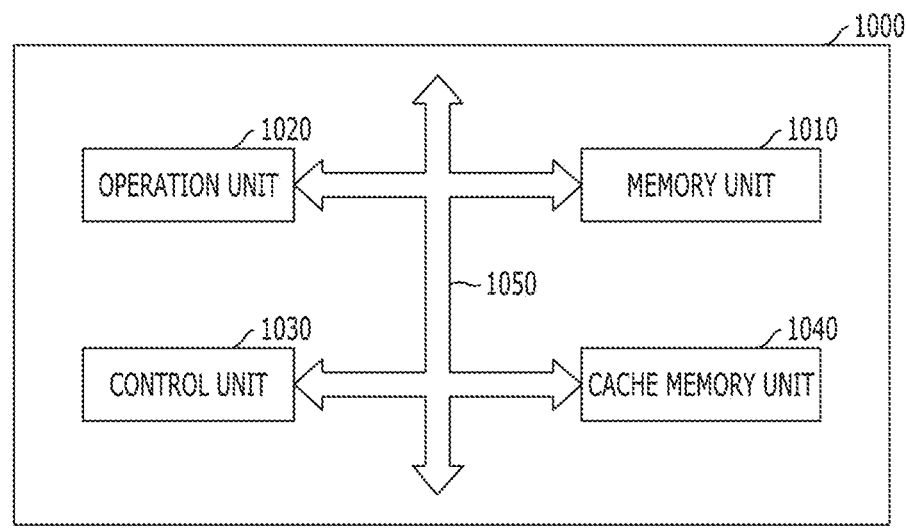
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a plurality of first bottom contacts arranged at a predetermined distance in a first direction and a second direction crossing the first direction; a plurality of source contacts alternately arranged between the first bottom contacts, and arranged at a predetermined distance in the first direction and the second direction; a plurality of source lines connected to the source contacts arranged in the second direction, respectively, among the plurality of source contacts; a plurality of etching prevention patterns formed over the plurality of source lines so as to overlap the source lines, respectively, and having a line width equal to or larger than a line width of the source lines; a plurality of second bottom contacts arranged to overlap the first bottom contacts; and a plurality of variable resistance elements arranged over the plurality of second bottom contacts so as to be in contact with the second bottom contacts. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
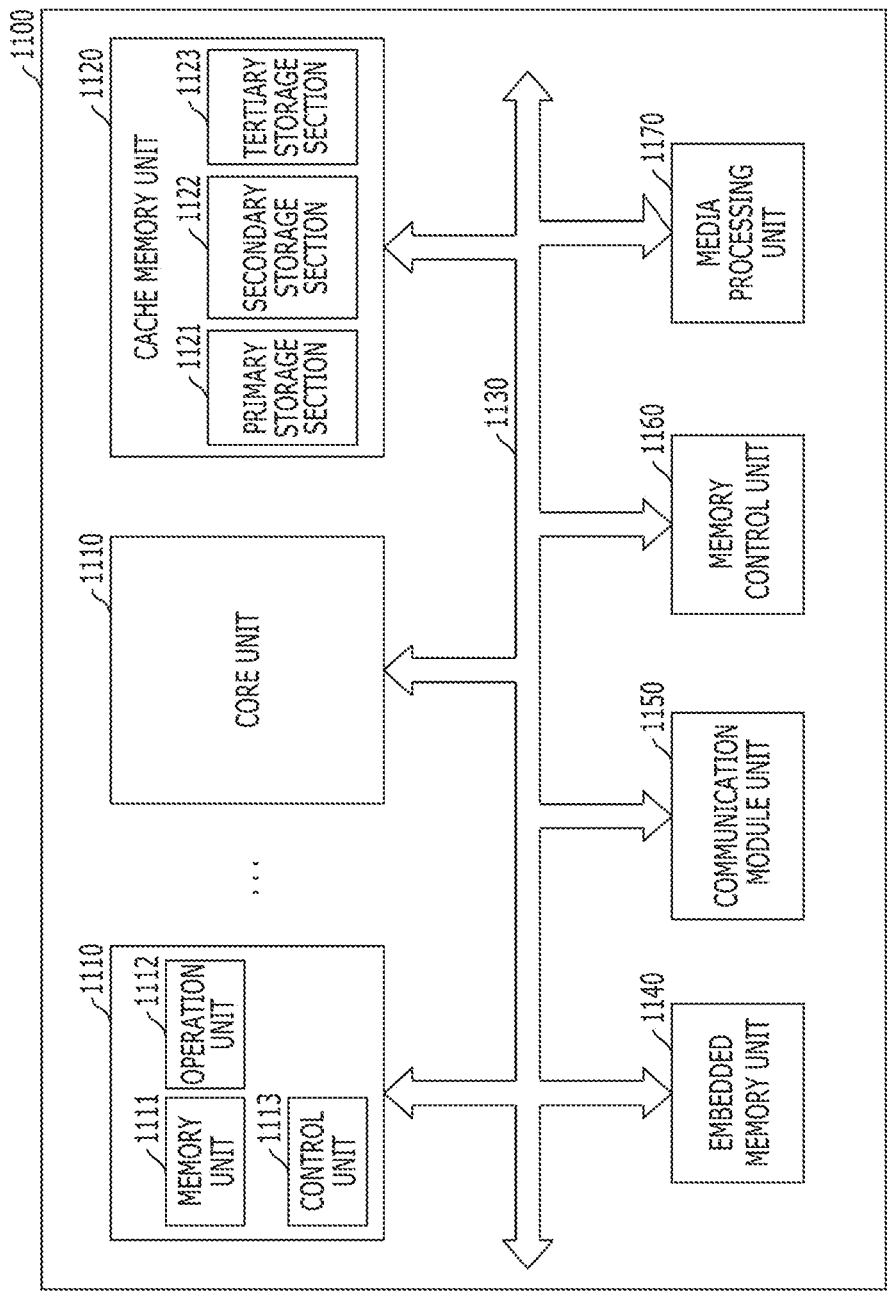
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a plurality of first bottom contacts arranged at a predetermined distance in a first direction and a second direction crossing the first direction; a plurality of source contacts alternately arranged between the first bottom contacts, and arranged at a predetermined distance in the first direction and the second direction; a plurality of source lines connected to the source contacts arranged in the second direction, respectively, among the plurality of source contacts; a plurality of etching prevention patterns formed over the plurality of source lines so as to overlap the source lines, respectively, and having a line width equal to or larger than a line width of the source lines; a plurality of second bottom contacts arranged to overlap the first bottom contacts; and a plurality of variable resistance elements arranged over the plurality of second bottom contacts so as to be in contact with the second bottom contacts. Through this, data storage characteristics of the cache memory unit 1120 may be improved. As a consequence, operating characteristics of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
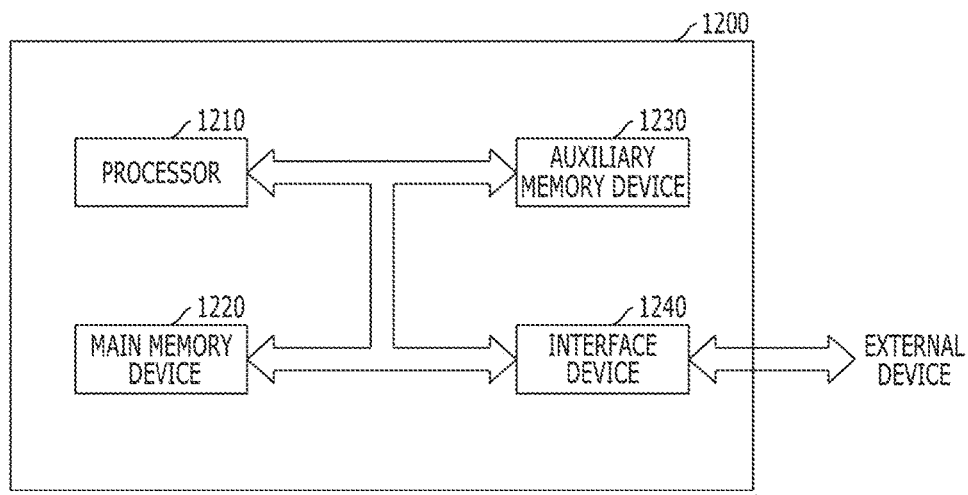
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a plurality of first bottom contacts arranged at a predetermined distance in a first direction and a second direction crossing the first direction; a plurality of source contacts alternately arranged between the first bottom contacts, and arranged at a predetermined distance in the first direction and the second direction; a plurality of source lines connected to the source contacts arranged in the second direction, respectively, among the plurality of source contacts; a plurality of etching prevention patterns formed over the plurality of source lines so as to overlap the source lines, respectively, and having a line width equal to or larger than a line width of the source lines; a plurality of second bottom contacts arranged to overlap the first bottom contacts; and a plurality of variable resistance elements arranged over the plurality of second bottom contacts so as to be in contact with the second bottom contacts. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a plurality of first bottom contacts arranged at a predetermined distance in a first direction and a second direction crossing the first direction; a plurality of source contacts alternately arranged between the first bottom contacts, and arranged at a predetermined distance in the first direction and the second direction; a plurality of source lines connected to the source contacts arranged in the second direction, respectively, among the plurality of source contacts; a plurality of etching prevention patterns formed over the plurality of source lines so as to overlap the source lines, respectively, and having a line width equal to or larger than a line width of the source lines; a plurality of second bottom contacts arranged to overlap the first bottom contacts; and a plurality of variable resistance elements arranged over the plurality of second bottom contacts so as to be in contact with the second bottom contacts. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
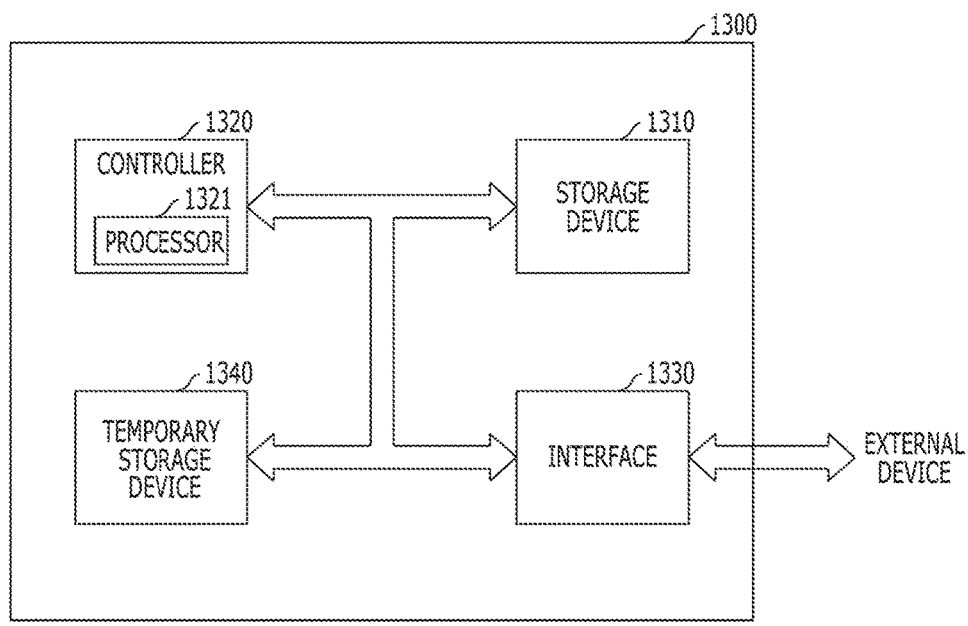
FIG. 10 is an example of configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a plurality of first bottom contacts arranged at a predetermined distance in a first direction and a second direction crossing the first direction; a plurality of source contacts alternately arranged between the first bottom contacts, and arranged at a predetermined distance in the first direction and the second direction; a plurality of source lines connected to the source contacts arranged in the second direction, respectively, among the plurality of source contacts; a plurality of etching prevention patterns formed over the plurality of source lines so as to overlap the source lines, respectively, and having a line width equal to or larger than a line width of the source lines; a plurality of second bottom contacts arranged to overlap the first bottom contacts; and a plurality of variable resistance elements arranged over the plurality of second bottom contacts so as to be in contact with the second bottom contacts. Through this, data storage characteristics of the storage device 1310 or the temporary storage device 1340 may be improved. As a consequence, operating characteristics and data storage characteristics of the data storage system 1300 may be improved.

Figure 11:
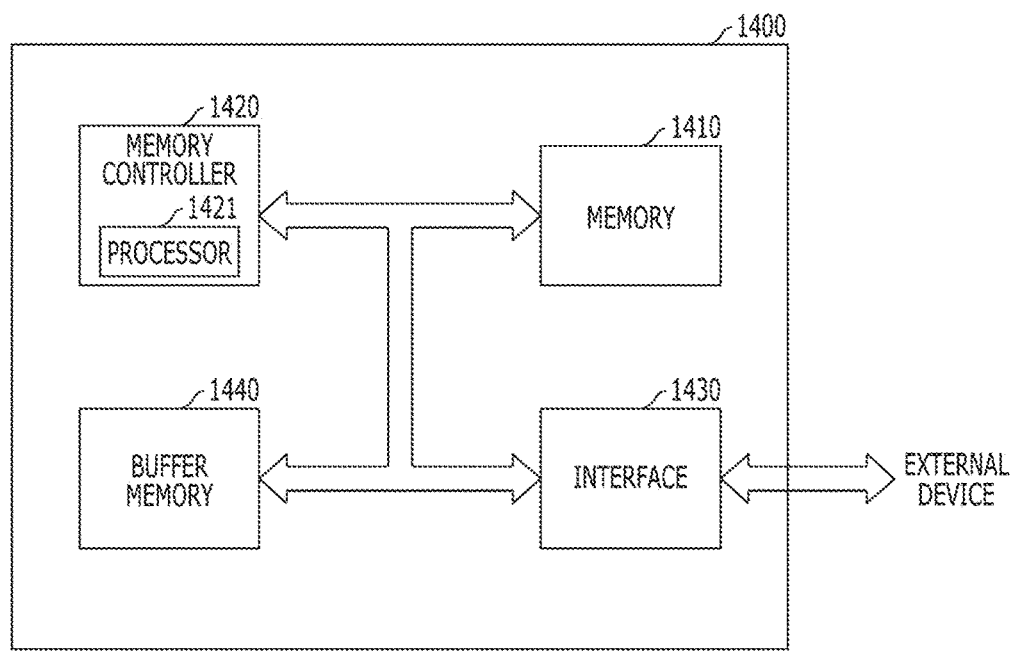
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a plurality of first bottom contacts arranged at a predetermined distance in a first direction and a second direction crossing the first direction; a plurality of source contacts alternately arranged between the first bottom contacts, and arranged at a predetermined distance in the first direction and the second direction; a plurality of source lines connected to the source contacts arranged in the second direction, respectively, among the plurality of source contacts; a plurality of etching prevention patterns formed over the plurality of source lines so as to overlap the source lines, respectively, and having a line width equal to or larger than a line width of the source lines; a plurality of second bottom contacts arranged to overlap the first bottom contacts; and a plurality of variable resistance elements arranged over the plurality of second bottom contacts so as to be in contact with the second bottom contacts. Through this, data storage characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a plurality of first bottom contacts arranged at a predetermined distance in a first direction and a second direction crossing the first direction; a plurality of source contacts alternately arranged between the first bottom contacts, and arranged at a predetermined distance in the first direction and the second direction; a plurality of source lines connected to the source contacts arranged in the second direction, respectively, among the plurality of source contacts; a plurality of etching prevention patterns formed over the plurality of source lines so as to overlap the source lines, respectively, and having a line width equal to or larger than a line width of the source lines; a plurality of second bottom contacts arranged to overlap the first bottom contacts; and a plurality of variable resistance elements arranged over the plurality of second bottom contacts so as to be in contact with the second bottom contacts. Through this, data storage characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory,
   wherein the semiconductor memory comprises:
   a plurality of first bottom contacts arranged at a predetermined distance in a first direction and a second direction crossing the first direction;
   a plurality of source contacts arranged between the first bottom contacts, and arranged at a predetermined distance in the first direction and the second direction;
   a plurality of source lines connected to the source contacts arranged in the second direction, respectively, among the plurality of source contacts;
   a plurality of etching prevention patterns formed over the plurality of source lines so as to overlap the source lines, respectively, and having a line width equal to or larger than a line width of the source lines;
   a plurality of second bottom contacts arranged to overlap the first bottom contacts; and
   a plurality of variable resistance elements arranged over the plurality of second bottom contacts so as to be in contact with the second bottom contacts.

2. The electronic device of claim 1, wherein the etching prevention pattern comprises a line pattern.

3. The electronic device of claim 1, wherein the etching prevention pattern is formed in a dog bone type with concave parts and convex parts, and the convex parts of the etching prevention pattern are located at positions corresponding to the first bottom contacts.

4. The electronic device of claim 1, wherein the source line comprises a dog bone type with concave parts and convex parts, and the concave parts of the source line are located at positions corresponding to the first bottom contacts.

5. The electronic device of claim 1, wherein the source line comprises a dog bone type with concave parts and convex parts, and the convex parts of the source line are located over the source contacts arranged in the second direction.

6. The electronic device of claim 1, wherein the source line and the etching prevention pattern comprise a dog bone type with concave parts and convex parts.

7. The electronic device of claim 1, wherein the source line comprises a dog bone type with concave parts and convex parts, and the etching prevention pattern comprises a reverse dog bone type of which convex parts and concave parts overlap the concave parts and convex parts of the source line, respectively.

8. The electronic device of claim 1, further comprising a spacer formed on both side surfaces of the source line.

9. The electronic device of claim 1, wherein the etching prevention pattern comprises an insulating material.

10. The electronic device of claim 1, wherein the etching prevention pattern comprises a nitride material.

11. The electronic device of claim 1, wherein the variable resistance element has a single-layer or multilayer structure which includes a metal oxide, a phase change material, a ferrodielectric material or a ferromagnetic material.

12. The electronic device of claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory is part of the memory unit in the microprocessor.

13. The electronic device of claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit,
wherein the semiconductor memory is part of the cache memory unit in the processor.

14. The electronic device of claim 1, further comprising a processing system which includes:
   a processor configured to decode a command received by the processor and control an operation for information based on a result of decoding the command;
   an auxiliary memory device configured to store a program for decoding the command and the information;
   a main memory device configured to call and store the program and the information from the auxiliary memory device such that the processor can perform the operation using the program and the information when executing the program; and
   an interface device configured to perform communication between at least one of the processor, the auxiliary memory device and the main memory device and the outside,
   wherein the semiconductor memory is part of the auxiliary memory device or the main memory device in the processing system.

15. The electronic device of claim 1, further comprising a data storage system which includes:
   a storage device configured to store data and conserve stored data regardless of power supply;
   a controller configured to control input and output of data to and from the storage device according to a command inputted form an outside;
   a temporary storage device configured to temporarily store data exchanged between the storage device and the outside; and
   an interface configured to perform communication between at least one of the storage device, the controller and the temporary storage device and the outside,
   wherein the semiconductor memory is part of the storage device or the temporary storage device in the data storage system.

16. The electronic device of claim 1, further comprising a memory system which includes:
   a memory configured to store data and conserve stored data regardless of power supply;
   a memory controller configured to control input and output of data to and from the memory according to a command inputted form an outside;
   a buffer memory configured to buffer data exchanged between the memory and the outside; and
   an interface configured to perform communication between at least one of the memory, the memory controller and the buffer memory and the outside,
   wherein the semiconductor memory is part of the memory or the buffer memory in the memory system.

17. The electronic device of claim 1, wherein each of the plurality of the variable resistance elements includes a material that switches between different resistance states according to a voltage or current applied across each of the plurality of the variable resistance elements.

18. The electronic device of claim 2, wherein the plurality of source lines are spaced apart from the plurality of second bottom contacts.

19. The electronic device of claim 2, further comprising a plurality of top contacts arranged over the plurality of variable resistance elements and connected to the plurality of variable resistance elements.

* * * * *